(12) United States Patent
Scheucher

(10) Patent No.: US 9,318,428 B2
(45) Date of Patent: Apr. 19, 2016

(54) CHIP HAVING TWO GROUPS OF CHIP CONTACTS

(75) Inventor: Heimo Scheucher, Langegg (AT)

(73) Assignee: NXP B.V., Eindhoven (NL)

( * ) Notice: Subject to any disclaimer, the term of this patent is extended or adjusted under 35 U.S.C. 154(b) by 476 days.

(21) Appl. No.: 11/628,131

(22) PCT Filed: May 18, 2005

(86) PCT No.: PCT/IB2005/051613
§ 371 (c)(1),
(2), (4) Date: Nov. 28, 2006

(87) PCT Pub. No.: WO2005/117109
PCT Pub. Date: Dec. 8, 2005

(65) Prior Publication Data
US 2008/0017980 A1 Jan. 24, 2008

(30) Foreign Application Priority Data
May 28, 2004 (EP) .................... 04 102 408

(51) Int. Cl.
*H01L 23/48* (2006.01)
*H01L 23/498* (2006.01)
*H01L 23/00* (2006.01)

(52) U.S. Cl.
CPC .... *H01L 23/49855* (2013.01); *H01L 23/49833* (2013.01); *H01L 24/05* (2013.01); *H01L 24/11* (2013.01); *H01L 24/12* (2013.01); *H01L 24/13* (2013.01); *H01L 24/10* (2013.01); *H01L 24/49* (2013.01); *H01L 2224/04042* (2013.01); *H01L 2224/05553* (2013.01); *H01L 2224/05554* (2013.01); *H01L 2224/05599* (2013.01); *H01L 2224/48137* (2013.01);

(Continued)

(58) Field of Classification Search
CPC .......................................... H01L 24/10–24/13
USPC .................. 257/679, 773, 776, 784, 786, 737
See application file for complete search history.

(56) References Cited

U.S. PATENT DOCUMENTS

| 5,334,803 A | 8/1994 | Yamamura et al. |
| 5,384,487 A | 1/1995 | Rostoker et al. |

(Continued)

FOREIGN PATENT DOCUMENTS

| EP | 0 907 207 | 4/1999 |
| EP | 1 111 672 A2 | 6/2001 |

(Continued)

OTHER PUBLICATIONS

Quirk & Serda, "Semiconductor Manufacturing Technology", New Jersey, Prentice-Hall, 2001, pp. 4.*

(Continued)

*Primary Examiner* — Yu Chen

(57) ABSTRACT

A chip (1) has a substrate (2), an integrated circuit (3) provided on the substrate (2), a plurality of conductor zones (ME1, ME2, ME3, ME4, ME5) and a passivating layer (5) provided to protect the conductor zones and the integrated circuit, through-holes (6, 7) being provided in the passivating layer (5) through which chip contacts (8, 9) are accessible, wherein additional chip contacts (10, 11) and connecting conductors (12, 13) are provided on the passivating layer (5) and wherein each additional chip contact has an electrically conductive connection to a chip contact via a connecting conductor.

20 Claims, 4 Drawing Sheets

(52) U.S. Cl.
CPC ............ *H01L 2224/48227* (2013.01); *H01L 2224/49171* (2013.01); *H01L 2224/85399* (2013.01); *H01L 2924/00014* (2013.01); *H01L 2924/01005* (2013.01); *H01L 2924/01006* (2013.01); *H01L 2924/01013* (2013.01); *H01L 2924/01014* (2013.01); *H01L 2924/01022* (2013.01); *H01L 2924/01033* (2013.01); *H01L 2924/01074* (2013.01); *H01L 2924/01082* (2013.01); *H01L 2924/05042* (2013.01); *H01L 2924/14* (2013.01)

(56) References Cited

U.S. PATENT DOCUMENTS

| | | | |
|---|---|---|---|
| 5,874,782 A * | 2/1999 | Palagonia | 257/778 |
| 5,994,783 A | 11/1999 | You | |
| 6,162,724 A * | 12/2000 | Hsia et al. | 438/669 |
| 6,232,666 B1 * | 5/2001 | Corisis et al. | 257/774 |
| 6,329,608 B1 * | 12/2001 | Rinne et al. | 174/261 |
| 6,359,342 B1 | 3/2002 | Yuan et al. | |
| 6,373,143 B1 | 4/2002 | Bell | |
| 6,420,788 B1 * | 7/2002 | Chen | 257/777 |
| 6,528,868 B1 * | 3/2003 | Weiblen et al. | 257/669 |
| 6,602,732 B2 * | 8/2003 | Chen | 438/106 |
| 6,707,159 B1 * | 3/2004 | Kumamoto et al. | 257/778 |
| 2002/0062430 A1 | 5/2002 | Brox et al. | |
| 2002/0066965 A1 | 6/2002 | Sasaki | |
| 2002/0149117 A1 * | 10/2002 | Shibata | 257/777 |
| 2003/0057567 A1 * | 3/2003 | Hedler et al. | 257/778 |
| 2003/0173667 A1 | 9/2003 | Yong et al. | |
| 2004/0188848 A1 | 9/2004 | Nojiri et al. | |
| 2004/0223305 A1 * | 11/2004 | Amiot et al. | 361/737 |
| 2005/0121804 A1 * | 6/2005 | Kuo et al. | 257/781 |

FOREIGN PATENT DOCUMENTS

| | | |
|---|---|---|
| GB | 2 244 864 | 12/1991 |
| JP | 63-216994 | 9/1988 |
| JP | 04-278542 | 10/1992 |
| JP | 2000-243898 A | 9/2000 |
| WO | 99/21226 | 4/1999 |
| WO | 0188979 A2 | 11/2001 |

OTHER PUBLICATIONS

Definition of "passivating", <http://www.merriam-webster.com/dictionary/passivating>, retrieved on May 24, 2012.*

* cited by examiner

CHIP HAVING TWO GROUPS OF CHIP CONTACTS

FIELD OF THE INVENTION

The invention relates to a chip, which chip is intended and arranged for use in at least one chip package, which chip package has a number of package contacts, which package contacts are accessible from outside the chip package, and which chip has a substrate, an integrated circuit provided on the substrate, a number of chip contacts, which chip contacts are accessible from outside the chip and are connected to the integrated circuit, and a passivating layer that protects the integrated circuit, through-holes being provided in the passivating layer and a chip contact being accessible through each through-hole.

The invention further relates to a chip package having a chip.

The invention further relates to a chip card having a chip package.

BACKGROUND OF THE INVENTION

A chip of the design set out in the first paragraph above and a chip package having a chip have been marketed in many variant versions and are generally familiar to those skilled in the art. In the known solutions, the designs are such that the chip contacts of the chip can be connected or are connected to the package contacts of a package by what is termed flip-chip technology or wire-bonding technology. Also, in many variant versions, the design is such that a chip package contains only a single known chip, the chip being of a design that is specially selected for the possible application in question. Hence, there are in the known cases restrictions which unfortunately limit the use of the variant versions of the known chip in different chip packages, which results in a reduction in the use that can be made of the variant versions of the known.

OBJECT AND SUMMARY OF THE INVENTION

It is an object of the invention to overcome the restrictions described above in a simple way and by using simple means and to produce an improved chip and an improved chip package.

To allow the object detailed above to be achieved, features according to the invention are provided in a chip according to the invention, thus enabling a chip according to the invention to be characterized in the manner specified below, namely:

A chip, which chip is intended and arranged for use in at least one chip package, which chip package has a number of package contacts, which package contacts are accessible from outside the chip package, and which chip has a substrate, an integrated circuit provided on the substrate, a number of chip contacts, which chip contacts are accessible from outside the chip and are connected to the integrated circuit, and a passivating layer that protects the integrated circuit, through-holes being provided in the passivating layer and a chip contact being accessible through each through-hole, wherein additional chip contacts and connecting conductors are provided on the passivating layer and wherein each additional chip contact has an electrically conductive connection to a chip contact via a connecting conductor.

To allow the object detailed above to be achieved, a chip of the design described in the previous paragraph is provided in a chip package having a chip.

To allow the object detailed above to be achieved, a chip package of the design described in the previous paragraph is provided in a chip card having a chip package.

By the measure of the features according to the invention there is obtained, simply and at no major additional cost or effort, a chip that is suitable both for allowing its chip contacts to be connected to package contacts by wire-bonding technology, a preset assignment, namely an assignment to a voltage or an assignment to a signal or signals, being laid down for each package contact, and also for allowing its chip contacts to be connected to the same package contacts, via the connecting conductors and the additional chip contacts, by flip-chip technology, and this to be done while allowing for the preset assignment of these package contacts, because what is termed a cross-connection is obtained with the help of the connecting conductors and the additional chip contacts. What is also achieved by the making of the measures according to the invention is that a chip according to the invention having chip contacts that are provided in a preset layout on the chip can easily be connected, via the connecting conductors and the additional chip contacts, to chip contacts of a second chip by the flip-chip technology, which chip contacts of the second chip are provided in a preset contact pattern and which additional chip contacts are provided on the chip according to the invention as a mirror image of the preset contact pattern. In this way, as a result of the making of the measures according to the invention, it easily becomes possible for a double-chip package to be produced. What also becomes possible as a result of the making of the measures according to the invention is that a chip having chip contacts that is intended and arranged for use in a given first chip package can be made suitable, with the help of the connecting conductors and additional chip contacts, for use in a given second or third or fourth chip package, by selecting for the additional chip contacts a position that makes it possible for the additional chip contacts to be easily and securely connected to respective package contacts on the second or third or fourth chip package.

In the case of a chip according to the invention, it has proved very advantageous if the chip contacts are arranged in a central region of the chip or of the passivating layer of the chip, which central region is situated substantially in the center between two mutually opposing edges of the chip or of the passivating layer of the chip, and if the additional chip contacts are arranged adjacent at least one edge of the chip or of the passivating layer of the chip. A design of this kind has proved to be particularly advantageous because, in a design of this kind, the chip contacts situated substantially in the center are particularly well suited to the making of a flip-chip connection and the additional chip contacts are particularly well suited to the making of a wire-bonding connection, in which wire-bonding connection any risk of a short-circuit being caused by the bond wires is virtually ruled out.

In a chip as described in the previous paragraph, it has also proved very advantageous if the chip contacts are arranged in a row and are substantially symmetrical about a plane of mirror symmetry of the chip or of the passivating layer of the chip, which plane of mirror symmetry extends parallel to the two mutually opposing edges of the chip or of the passivating layer of the chip and divides the chip or the passivating layer of the chip substantially with mirror symmetry. A design of this kind has proved advantageous with regard to the production, in a manner that is as simple and uncomplicated as possible, of a flip-chip connection.

In a chip according to the invention, it has proved very advantageous if each of the chip contacts is formed by a pad and if, of all the pads, at least some have connected to them a bump that is applied by means of a bumping process, which bump is of a nominal height. What is ensured in this way is that electrically conductive connections that are particularly reliable in operation can be ensured when flip-chip technology is used.

In a chip according to the invention as described in the previous paragraph, it has also proved very advantageous if each of the additional chip contacts is formed by an additional bump and if each of the connecting conductors is formed by an elongated connecting bump, which additional bumps are of a nominal height and which elongated connecting bumps are of a nominal height. This is equally advantageous with regard to the production of electrically conductive connections that are as reliable as possible in operation between the additional chip contacts and paired contacts which have been or are to be brought into electrically conductive connection with these additional chip contacts.

In a chip according to the invention as described above, it has proved to be particularly advantageous if the additional bumps and the elongated connecting bumps are applied to the passivating layer by the same bumping process, which bumping process was used to apply the bumps to the pads. This gives the major advantage that both the bumps, and the additional bumps, and also the elongated connecting bumps between the bumps and the additional bumps can be produced by the same bumping process, which is advantageous with a view to a design which is as simple as possible and with a view to low production costs.

In a chip according to the invention as described in the previous paragraph, it has proved advantageous if the height of the bumps, the height of the elongated connecting bumps and the height of the additional bumps are nominally of equal sizes. This is advantageous with a view to particularly simple production.

In a chip according to the invention, it has however also proved very advantageous if the height of the additional bumps is greater than the height of the elongated connecting bumps and the height of the bumps. A design of this kind is particularly advantageous when a chip according to the invention is to be used with a second chip in a double-chip package and the additional bumps are to be, or are, connected to chip contacts of the second chip, because the greater height of the additional bumps then ensures that, because of the low connecting bumps and bumps, no short-circuits can be caused in the region of the second chip.

In a chip package according to the invention, a design may be provided in which two chips according to the invention are arranged next to one another and in which electrically conductive connections between the two chips lying next to one another are produced with the help of the additional chip contacts of the chips lying next to one another, with an electrically conductive connection being formed between two additional chip contacts in each case by means of a bond wire.

In a chip package according to the invention, it has proved particularly advantageous if, in addition to the chip as claimed in any one of claims 1 to 8, the chip package also contains a second chip having a number of chip contacts, and if the chip contacts of the second chip and the additional chip contacts of the chip according to the invention are arranged opposite one another, and if at least one chip contact of the second chip has an electrically conductive connection to an additional chip contact. In this way, it is possible to obtain a chip package of small area having two chips, where the electrically conductive connections between the two chips are produced in a simple and reliable fashion by flip-chip technology.

It should be mentioned that a chip package according to the invention may also contain more than two chips, such as three or four chips for example.

These and other aspects of the invention are apparent from and will be elucidated with reference to the embodiments described hereinafter, to which however the invention is not limited.

DESCRIPTION OF EMBODIMENTS

Figure 1:
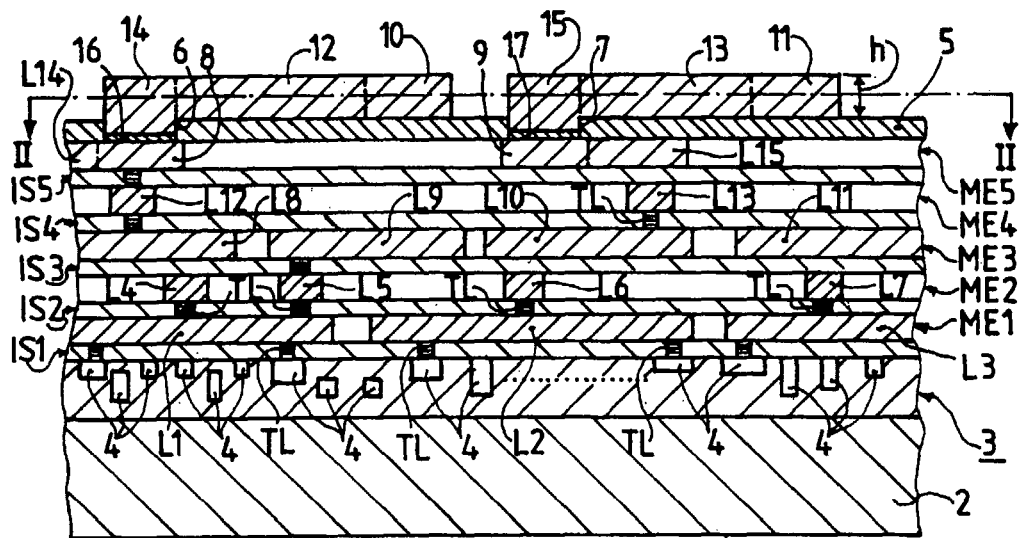
FIG. 1 is a section on line I-I in FIG. 2 showing part of a chip according to a first embodiment of the invention.

FIG. 1 shows part of a chip 1, which chip 1 is produced on the basis of silicon. It should be mentioned that such a chip may also be produced on the basis of a polymer material. The chip 1 is intended and arranged, in a manner known per se, for use in at least one chip package. A chip package of this kind, likewise in a manner known per se, has a number of package contacts, which package contacts are accessible from outside the package, a subject that will be considered in greater detail below.

The chip 1 has a substrate 2 that may also be referred to as a base member. Produced on the substrate 2 is an integrated circuit 3 that is only indicated very schematically in FIG. 1. The production and configuring of an integrated circuit 3 of this kind is generally familiar to those skilled in the art and therefore does not need to be described in any greater detail in the present connection. The integrated circuit 3 contains a plurality of circuit components 4, which are shown in a highly schematic form in FIG. 1.

On its face region remote from the substrate 2, the chip 1 is provided with a passivating layer 5. The passivating layer 5 is often also referred to as a protective layer or covering layer. The passivating layer 5 is intended and arranged to protect the parts of the chip 1 that are situated beneath it. The passivating layer 5 is preferably composed of silicon nitride (SiN) but may also be produced from other materials. Provided in the passivating layer 5 are through-holes, through which through-holes electrically conductive chip contacts, which are in the form of contact areas, or in other words so-called pads, are accessible, which is likewise something that is generally familiar. Two such through-holes 6 and 7 are shown in the passivating layer 5 in FIG. 1. It should be mentioned that the chip 1 also has further through-holes of this kind, but that these are not visible in FIG. 1.

Between the integrated circuit 3 and the passivating layer 5, the chip 1 has a total of five layer-like conductor zones ME1, ME2, ME3, ME4 and ME5. To isolate the conductor zone ME1 from the integrated circuit 3 electrically, and to isolate the conductor zones ME1 to ME5 from one another electrically, layer-like isolating zones IS1, IS2, IS3, IS4 and IS5 are provided. Isolating zones IS1, IS2, IS3, IS4 and IS5 are each composed of an isolating layer of non-conductive oxide, which is also intended for planarizing purposes.

Provided in the conductor zones ME1 to ME5 are useful conductors L1, L2, L3, L4, L5, L6, L7, L8, L9, L10, L11, L12, L13, L14 and L15. Connected to the two useful conductors L14 and L15 situated in the fifth conductor zone ME5, the zone situated at the top, are respective ones of chip contacts 8 and 9. The two chip contacts 8 and 9 are formed in this case by so-called pads, which are of a rectangular planar form. They may also be of a square planar form. The useful conductors in each conductor zone ME1 to ME5 preferably extend in one direction and parallel to one another. The useful conductors in two mutually adjacent conductor zones preferably extend perpendicularly to one another in this case. The useful conductors are isolated from one another by means of the isolating zones IS1 to IS5. The useful conductors are intended for connecting the circuit components 4 of the integrated circuit 3 and for passing on useful signals. To make it possible for these functions to be performed, some of the useful conductors in different conductor zones ME1 to ME5 are connected together, where this is required.

For this purpose, the isolating zones IS1 to IS5 are provided with through-holes but these have not been given reference numerals in FIG. 1 so that the clarity of the drawing will not be reduced unnecessarily. Provided in the through-holes in the isolating zones IS1 to IS5 are through-conductors that are often referred to by those skilled in the art as "vias". In FIG. 1, only some of the vias have been identified by the reference TL. With the help of the vias TL, two useful conductors that are situated in immediately adjoining conductor zones ME1 to ME5 are connected together by an electrical conductive connection. The useful conductors L1 to L 15 and the vias TL are produced by known methods, something that has long been known and will therefore not be described in detail here. It should be mentioned that the useful conductors and the vias are produced with the help of aluminum. The useful conductors may however also be produced from other metals or metal alloys.

Figure 2:
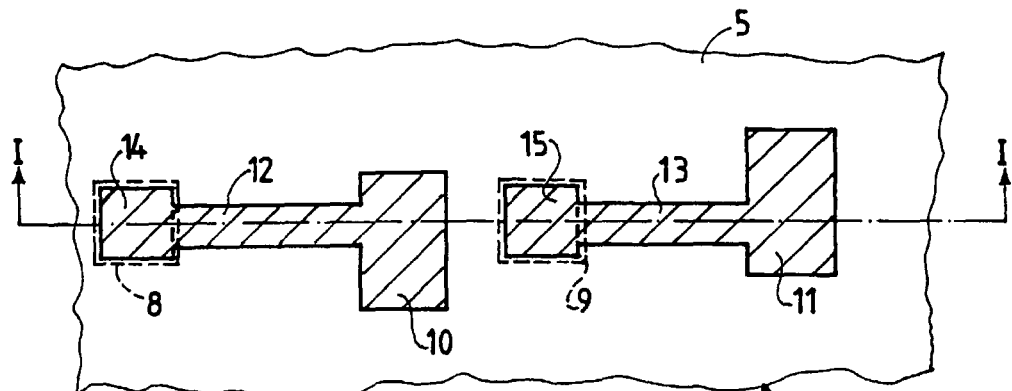
FIG. 2 is a section on line II-II in FIG. 1 showing part of the chip shown in FIG. 1.

The chip 1 shown in FIGS. 1 and 2 has a plurality of chip contacts that are each formed by a pad. Of all the chip contacts only two, 8 and 9, are shown in FIG. 1. The chip contacts (pads) 8, 9 are accessible from outside the chip 1 either directly, or indirectly via bumps, something that will be looked at in greater detail below. The chip contacts 8, 9 are connected to the integrated circuit 3, which is done with the help of the useful conductors and the vias, both of which have been referred to above. Each of the chip contacts (pads) 8, 9 that are provided is accessible in this case through a through-hole 6, 7 in the passivating layer 5. The passivating layer 5 protects the conductor zones ME1 to ME5 and the integrated circuit 3 situated below them (including, e.g., the regions 16 and 17 of layer 5).

The chip 1 advantageously has additional chip contacts and connecting conductors provided on the passivating layer 5, each additional chip contact having an electrically conductive connection to a chip contact, i.e. a pad, via a connecting conductor. Only two such additional contacts 10 and 11 provided on the passivating layer 5, and two connecting conductors 12 and 13 provided on the passivating layer 5, can be seen in FIGS. 1 and 2. Additional chip contact 10 has an electrically conductive connection via connecting conductor 12 to chip contact 8 in this case, and additional chip contact 11 has an electrically conductive connection via connecting conductor 13 to chip contact 9.

As has already been described above, each of the chip contacts 8, 9 is formed by a pad. In the case of the chip 1 shown in FIGS. 1 and 2, certain pads each have connected to them a bump which is applied to the pad concerned by a bumping process, which bump is of a nominal height h, which nominal height h extends between the exposed main face of the passivating layer 5 and the free end of the bump. Of all the bumps provided on the chip 1, two, 14 and 15, can be seen in FIGS. 1 and 2. The bumps 14, 15 have good connections both electrical and mechanical to the chip contacts (pads) 8, 9, a connecting layer 16, 17 of titanium- tungsten (TiW) being provided between the chip contacts 8, 9 and the bumps 14, 15 to ensure that there is a good mechanical connection, as is known per se.

In the case of the chip 1 shown in FIGS. 1 and 2, each of the additional chip contacts 10, 11 is formed by an additional bump and each of the connecting conductors 12, 13 is formed by an elongated connecting bump, the additional bumps being of a nominal height h and the elongated connecting bumps likewise being of a nominal height h. The state of affairs that exists in the case of the chip 1 shown in FIGS. 1 and 2 is thus that the height h of the bumps 14, 15, the height h of the elongated connecting bumps provided as connecting conductors, and the height h of the additional bumps provided as additional chip contacts 10, 11 are nominally equal and all are of the same size h.

It should also be mentioned that the additional bumps and the elongated connecting bumps were applied to the passivating layer 5 by the same bumping process, with which bumping process the bumps 14, 15 were applied to the chip contacts (pads) 8, 9. This is advantageous with a view to having all the bumps, and consequently the chip 1, produced as simply and inexpensively as possible. The execution of the bumping process, i.e. the production of the bumps, the elongated connecting bumps and the additional bumps, takes place by a bumping process and at a bumping location which are separate from the chip producing process and the chip producing location.

Explicit mention should however be made of the fact that it is also possible, and in certain case beneficial, for the bumps to be produced in a first bumping process and the additional bumps and the connecting bumps to be produced in a second bumping process. It this way, it becomes possible for the bumps on the one hand and the additional bumps and connecting bumps on the other hand firstly to be produced at different times and secondly to be produced from different materials, which for example gives the advantage that the additional bumps and the connecting bumps can be produced from a material that makes a particularly good mechanical connection to the passivating layer, by which means a particularly good and ageing-resistant mechanical connection to the passivating layer and one that is able to carry loads well can be obtained or is ensured.

In the case of the chip 1 shown in FIGS. 1 and 2, and as cannot be seen in these Figures, all the chip contacts (pads) such as 8, 9 are connected to bumps such as 14, 15 and via connecting conductors such as 12, 13 to additional chip contacts (pads) such as 10, 11. This need not necessarily be the case, because it is also possible for only some of the pads to be provided with a bump, which bump has an electrically conductive connection to an additional bump via an elongated connecting bump. The rest of the pads are then not covered by a bump and are available as original pads, in which case what is termed a wire-bond connection can then be made, or may then be provided, between these original pads and package contacts.

Figure 3:
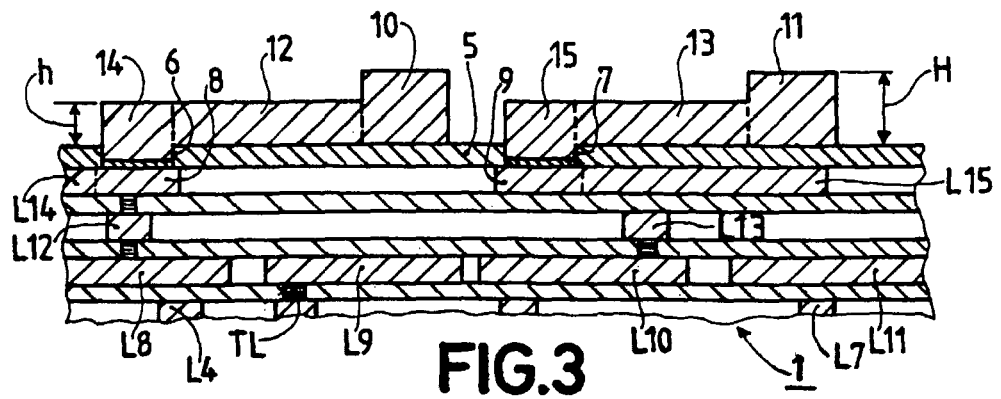
FIG. 3 is a view similar to FIG. 1 showing part of a chip according to a second embodiment of the invention.

FIG. 3 shows part of a further chip 1, the design of which is largely identical to that of the chip 1 shown in FIGS. 1 and 2. In the case of the chip 1 shown in FIG. 3 however the design of the additional chip contacts 10 and 11 is different from that of the additional chip contacts 10 and 11 of the chip 1 shown in FIG. 1. In the case of the chip 1 shown in FIG. 3, the design of the additional chip contacts 10, 11 is such that, although the additional chip contacts are also formed by additional bumps, these additional bumps are of a height H, which height H is greater than the height h of the elongated connecting bumps and the height h of the bumps 14, 15. A design of this kind has proved advantageous in a range of applications.

Further to what has been said regarding the design arrangements relating to the bumps, elongated connecting bumps and additional bumps on the chips 1 shown in FIGS. 1, 2 and 3, another point that should be mentioned is that for other applications it has also proved advantageous if the bumps are of a greater height than the elongated connecting bumps and the additional bumps.

Figure 4:
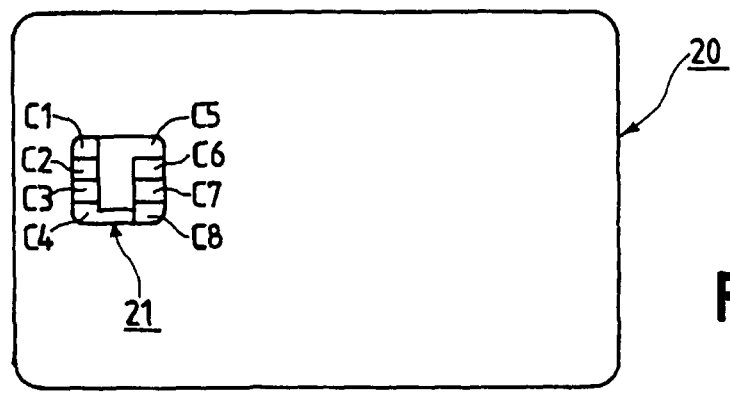
FIG. 4 is a view from above of a chip card according to one embodiment of the invention, in which chip card is included a chip package according to a first embodiment of the invention, which chip package contains a chip according to a third embodiment of the invention.
Figure 5:
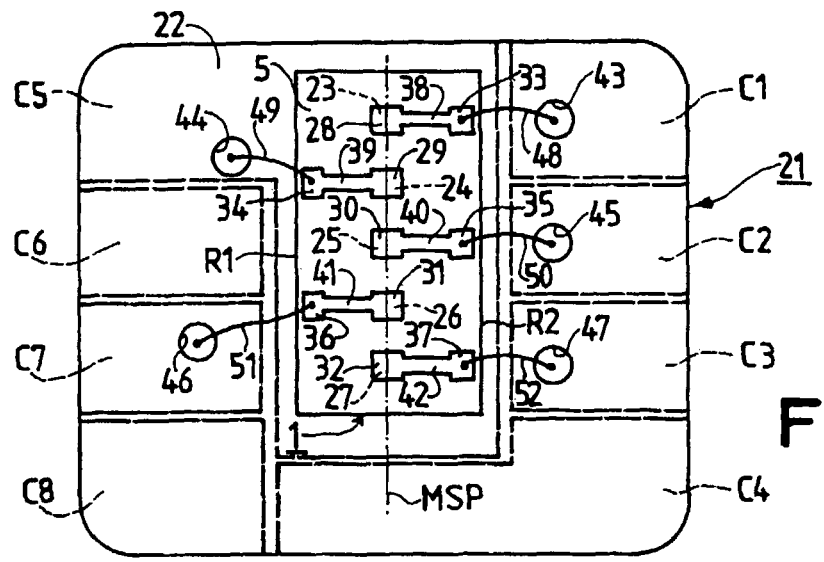
FIG. 5 is a view from below of the chip package that is included in the chip card shown in FIG. 4 and contains the chip according to the third embodiment of the invention.

FIG. 4 shows a chip card 20 according to the invention, in which chip card 20 a chip package 21 according to the invention is accommodated. The chip package 21 of the card or data-carrier 20 is shown in FIG. 5 to an enlarged scale and in greater detail. With regard to the chip package 21, it should be mentioned that said chip package 21 is designed to largely comply with standard ISO 7816.

The chip package 21 has a chip carrier 22. To one main face of the chip carrier 22 (which face is the one not visible in FIG. 5), eight contact areas C1, C2, C3, C4, C5, C6, C7 and C8 are applied in conformity with the above-mentioned standard. Each of these eight contact areas C1, C2, C3, C4, C5, C6, C7 and C8 forms a package contact that is accessible from outside the package, for contact pins of a chip-card read/write station for example. Securely connected mechanically to the opposite main face (which is the face that is visible in FIG. 5) is a chip 1 according to the invention. The chip 1 has five chip contacts (pads) 23, 24, 25, 26 and 27 that are not visible in FIG. 5. Each of the five chip contacts 23 to 27 has a bump 28, 29, 30, 31 or 32 connected to it.

The chip 1 also has five additional chip contacts 33, 34, 35, 36 and 37 that are situated on the passivating layer 5 of the chip 1 and are each formed by an additional bump, which additional chip contacts 33, 34, 35, 36 and 37 have electrically conductive connections to respective bumps 28, 29, 30, 31 and 32 via respective connecting conductors 38, 39, 40, 41 and 42 formed by respective elongated connecting conductors.

Provided in the chip carrier 22 are through-holes 43, 44, 45, 46 and 47, which through-holes 43 to 47 give access to the contacts C1, C2, C3, C5 and C7. By way of the said through-holes 43 to 47, the additional chip contacts 33 to 37 have electrically conductive connections to their respective associated contacts C1, C5, C2, C7 and C3 via respective bond wires 48, 49, 50, 51 and 52.

An advantage of the design of the chip 1 and chip package 21 shown in FIG. 5 is that the bond wires 48 to 52 provided between the additional chip contacts 33 to 37 and the respective package contacts C1, C5, C2, C7 and C3 are only very short, the additional chip contacts 33 to 37 being arranged adjacent the two edges R1 and R2 of the chip 1 and consequently no physical contact being possible between the bond wires 48 to 52 and the edges R1 and R2 of the chip 1. It is in fact vital for any such physical contact to be avoided in view of possible damage to or destruction of such bond wires. If there were no additional chip contacts 33 to 37 provided on the chip 1 shown in FIG. 5, the bond wires 48 to 52 would have to be run from the package contacts C1, C5, C2, C7 and C3 to the bumps 28 to 32 (or to the pads situated below them if no bumps had been provided), which would then result in the length of the bond wires being approximately doubled and thus in a substantially greater risk of the bond wires making physical contact with the edges R1 and R2 of the chip 1.

Figure 6:
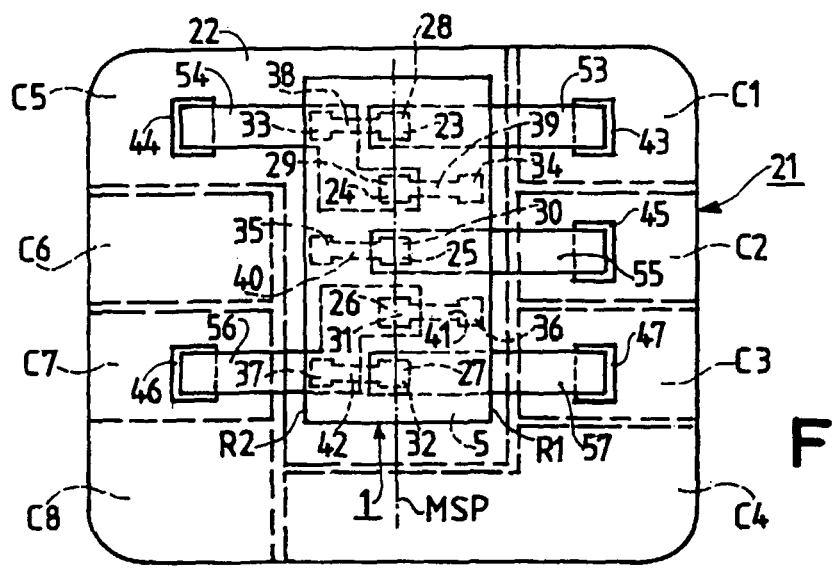
FIG. 6 is a view similar to FIG. 5 showing a chip package according to a second embodiment of the invention, which chip package contains the chip according to the third embodiment of the invention.

The chip 1 used in the chip package 21 shown in FIG. 5 may also advantageously be used in another chip package 21, which other chip package 21 is shown in FIG. 6. The other chip package 21 shown in FIG. 6 likewise has a chip carrier 22, which chip carrier 22 likewise has applied to it, on that main face of the chip carrier 22 that is not visible in FIG. 6, eight package contacts C1 to C8. There are also five through-holes 43 to 47 provided in the chip carrier 22, which in this case are rectangular in shape. From each of the five through-holes 43 to 47, there extend, to a central region of the chip package 21, respective ones of traces 53, 54, 55, 56 and 57 that are applied to the main face that is visible in FIG. 6, as a result of which the ends of the traces 53 to 57 remote from the through-holes 43 to 47 are arranged in a central region of the chip 1, or of its passivating layer 5, which region is situated substantially in the center between the two mutually opposing edges R1 and R2 of the chips 1, or of its passivating layer 5. The traces 53, 54, 55, 56 and 57 each have electrically conductive connections through respective ones of the through-holes 43 to 47 to respective ones of the package contacts C1, C5, C2, C7 and C3.

In the case of the chip package 21 shown in FIG. 6, the chip 1 is connected to the chip package 21 by what is termed flip-chip technology. What this means is that, in the case of the chip package 21, the chip 1 is connected to the chip carrier 22 in a position in which it is inverted through 180.degree. from the position shown in FIG. 5. When this is done, electrically conductive connections are made between the bumps 28 to 32 and the traces 53 to 57. In this solution, the bumps 28 to 32 are higher that the elongated connecting bumps that are provided as connecting conductors 38 to 42 and the additional bumps that are provided as additional chip contacts 33 to 37, thus ensuring that the additional chip contact 33 cannot make an electrically conductive connection to the trace 54 and the additional chip contact 37 cannot make an electrically conductive connection to the trace 56. The relative heights just mentioned also exist of course in the case of the chip 1 in the chip package 21 shown in FIG. 5 if the same chip 1 is provided in both cases. However, the design provided in the case of the chip packages shown in FIGS. 5 and 6 may also be one in which the bumps, elongated connecting bumps and additional bumps are all of the same height, though care then has to be taken in the case of the chip package shown in FIG. 6 to see that at least the traces 54 and 56 are provided with an isolating layer on their faces remotes from the chip carrier 22 to prevent short-circuits from occurring with the additional chip contacts 33 and 37. The design selected may also be one in which no overlaps arise between voltage-carrying conductors that might make it possible for a short-circuit to occur.

In the case of the chip 1 in the chip package 21 shown in FIGS. 5 and 6, the design is such that the chip contacts (pads) 23 to 27 and the bumps 28 to 32 connected thereto are arranged in a central region of the chip 1, or of the passivating layer 5 of the chip 1, which region is situated substantially in the center between the two mutually opposing edges R1 and R2 of the chip 1, or of the passivating layer 5 of the chip 1, and is also such that the additional chip contacts 33 to 37 are arranged adjacent two edges R1 and R2 of the chip or of the passivating layer of the chip. The design is also such that the chip contacts 23 to 27 and the bumps 28 to 32 connected thereto are arranged in a row and are arranged to be substantially symmetrical about a plane of mirror symmetry MSP of the chip 1 or of its passivating layer 5. The plane of mirror symmetry extends in this case parallel to the mutually opposing edges R1 and R2 of the chip or of the passivating layer 5 of the chip 1 and divides the chip 1 or the passivating layer 5 of the chip 1 into halves that are substantially mirror images of one another.

Figure 7:
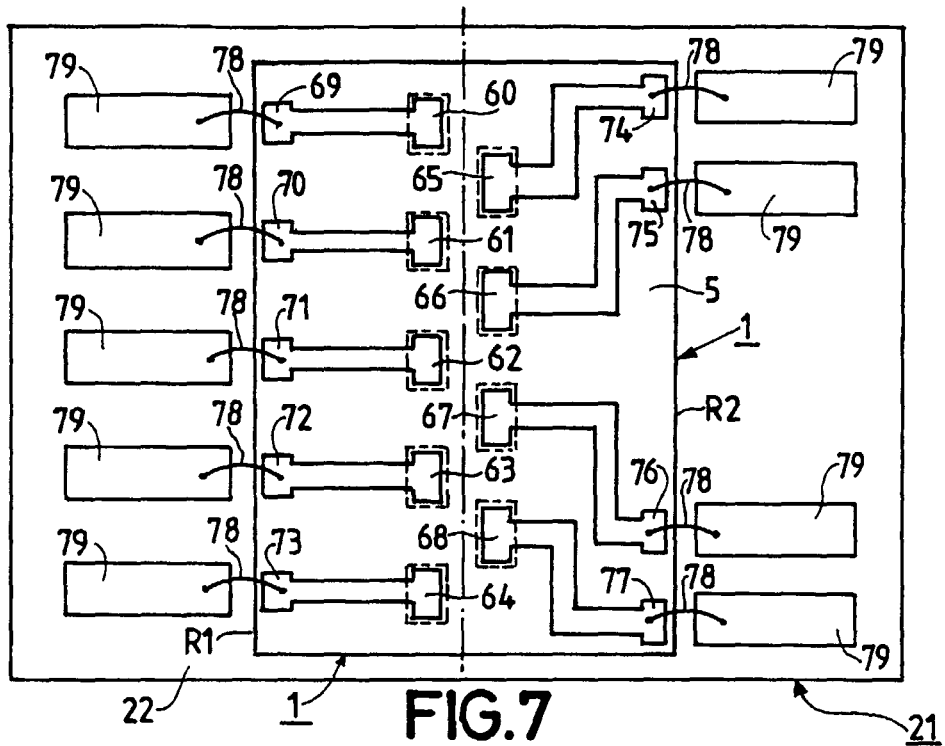
FIG. 7 is a view from above of a chip package according to a third embodiment of the invention, which chip package contains a chip according to a fourth embodiment of the invention.

A design for a chip that is similar to the design shown for the chip 1 in FIGS. 5 and 6 can be seen in FIG. 7. Shown in FIG. 7 is a further chip package 21 according to the invention. The chip package 21 contains a chip 1 in which the chip contacts, and the bumps 60 to 68 applied to the chip contacts, are likewise arranged in a central region situated in the center between two mutually opposing edges R1 and R2 of the chip 1, and the additional chip contacts 69 to 77 formed by additional bumps are arranged adjacent the two edges R1 and R2 of the chip 1. In this case however the chip contacts and the bumps 60 to 68 connected thereto are arranged in two rows, as can be seen from FIG. 7. In the design shown in FIG. 7, the additional chip contacts 69 to 77 are each connected to a package contact 79 via a bond wire 78. In the case of the design shown in FIG. 7 too, it is possible to manage with especially short bond wires 78 and the advantages make possible by a short bond wire are obtained in this way.

Figure 8:
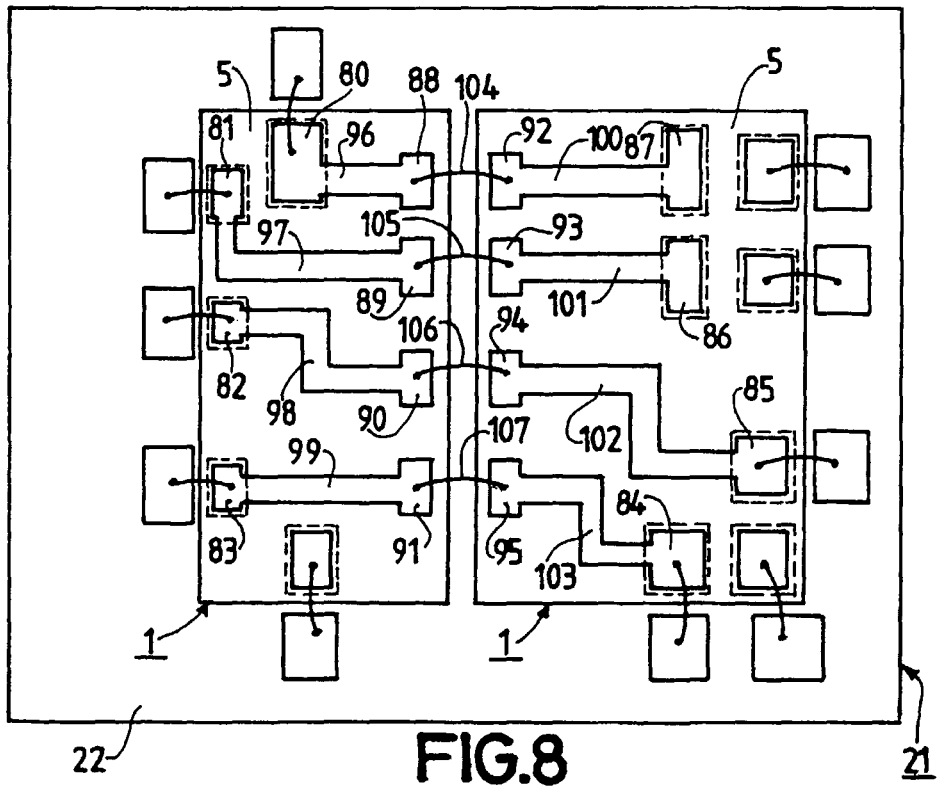
FIG. 8 is a view similar to FIG. 7 showing a chip package according to a fourth embodiment of the invention, which chip package contains two chips, one according to a fifth embodiment of the invention and one according to a sixth embodiment of the invention.

A further chip package 21 is shown in FIG. 8, what is special about this chip package 21 being that two chips 1 according to the invention are provided on the chip carrier 22. The two chips 1 are arranged next to one another in this case, with some of the chip contacts each being provided with a bump 80 to 87 and with each of these bumps 80 to 87 having an electrically conductive connection to an additional chip contact 88 to 95 formed by an additional bump via, in each case, a connecting conductor 96 to 103 formed by an elongated connecting bump. The additional bumps that are intended as additional chip contacts 88 to 95 are connected together by electrically conductive connections in this case by means of bond wires 104, 105, 106 and 107. The chips 1, which are situated next to one another in this case, are connected by electrically conductive connections by means of the four bond wires 104 to 107. It is expressly pointed out that in fact it is not merely four bond wires that are provided but a larger number of such bond wires. What is essential however is not the number of bond wires but the fact that the bond wires 104 to 107 intended for connecting the two chips 1 are of a particularly short form and consequently that the advantages that are made possible by short bond wires exist in this case.

Figure 9:
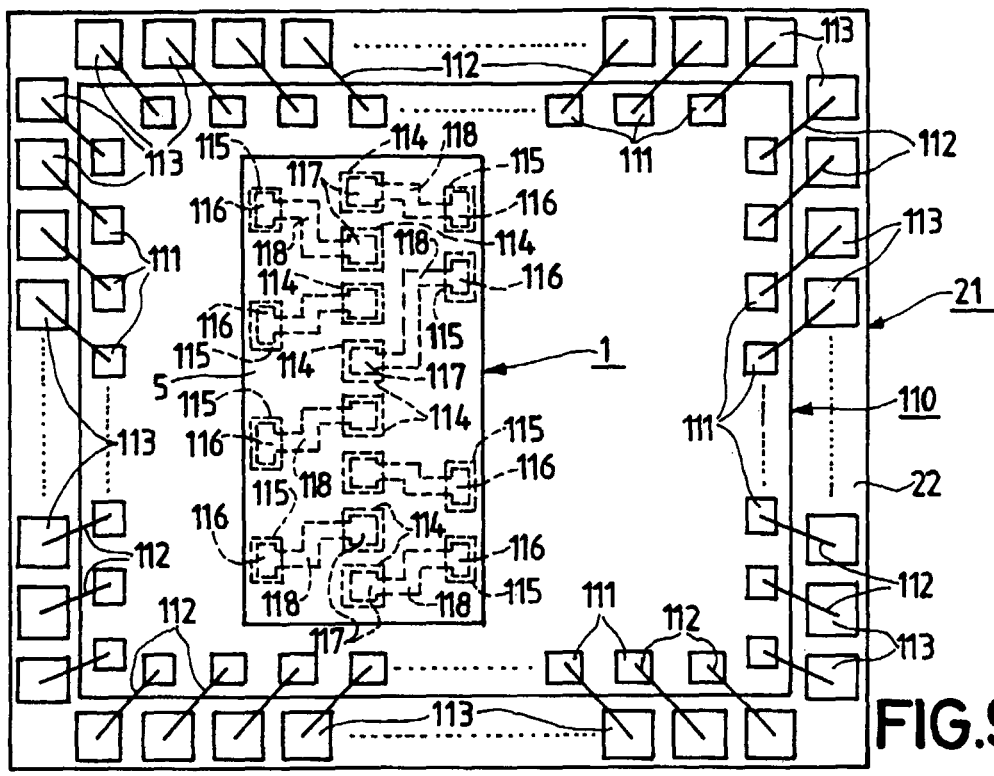
FIG. 9 is a view similar to FIGS. 7 and 8 showing a chip package according to a fifth embodiment of the invention, which chip package contains a chip according to a seventh embodiment of the invention.

FIG. 9 shows a further chip package 21. In the case of this chip package 21, a conventional chip 110 is mounted on the chip carrier 22, which conventional chip 110 has a plurality of chip contacts (pads) 111. The chip contacts 111 are each connected by a bond wire 112 to a package contact 113, the package contacts 113 being provided on the chip carrier 22. The conventional chip 10 is provided with a total of eight connecting contacts that are arranged in a row in its central region. The connecting contacts 114 are used to connect up a chip 1 according to the invention.

The chip 1 according to the invention is a commercially available memory chip that is known per se and that has, in the available version, eight chip contacts (pads) 115.

Figure 10:
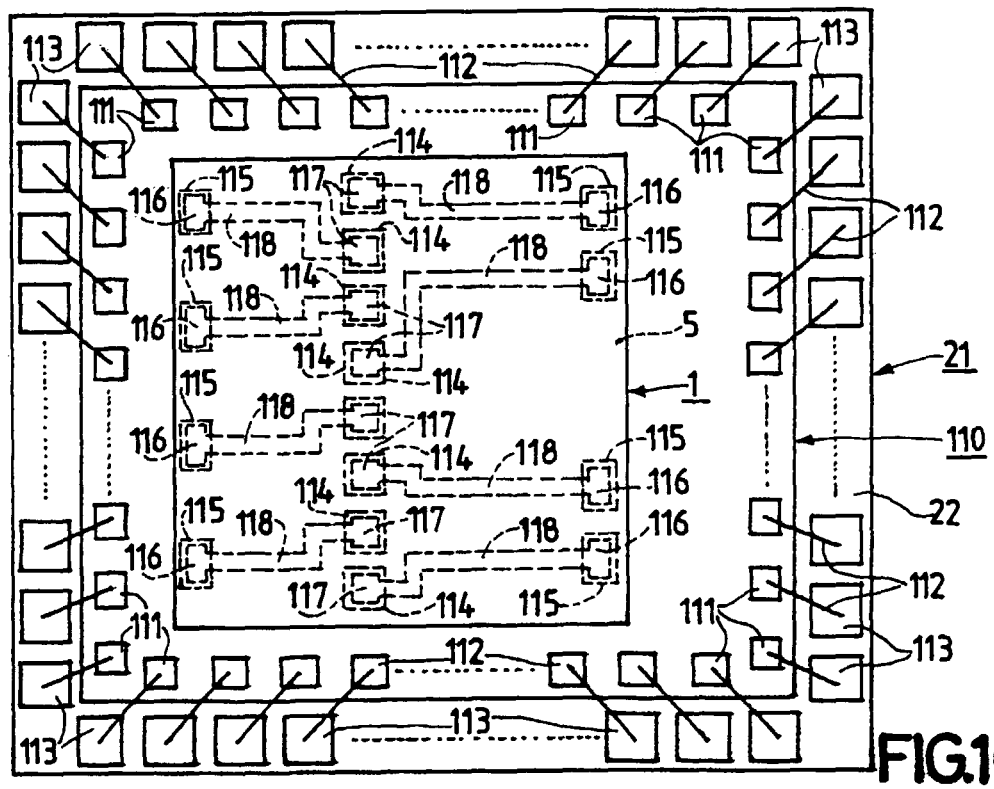
FIG. 10 is a view similar to FIG. 9 showing a chip package according to a sixth embodiment of the invention, which chip package contains a chip according to an eighth embodiment of the invention.

Of this memory chip that is, per se, available, different designs are available that differ in respect of their storage capabilities. A first design is shown in FIG. 9 and a second design is shown in FIG. 10.

In accordance with the present invention, the memory chips that are, per se, available, have been provided retrospectively with added bumps 116, added additional bumps 117 and added connecting bumps 118, which has produced the memory chip 1 according to the invention. The design and arrangement of the additional bumps 117 were made such in this case that, regardless of their size, the memory chips 1 according to the invention can easily be connected to the connecting contacts of the conventional chip 110 by flip-chip technology. It is therefore easily possible in this way for commercially available memory chips that differ in respect of their storage capabilities and in respect of their size to be converted into memory chips designed in accordance with the invention, thus making it possible for memory chips according to the invention to be connected to conventional chips 110 in a way that is easy and is not affected by the size of the chips. Possibilities of this kind are a great advantage particularly when the conventional chip 110 is a so-called processor chip that is intended and arranged to work with memory chips having different storage capacities.

A particularly important application for the measures according to the invention is briefly described below. This application should be assumed to involve an existing chip package that preferably complies with a given standard or a given standard specification and that contains an existing chip. It quite often happens that a demand arises for a new chip package that is amended in comparison with the existing chip package, there being different locational requirements for the chip contacts in this new chip package, which consequently have to be met. The result of this is that the existing chip cannot now easily be used in the new chip package. Hitherto, this problem was solved by developing and creating a chip that was partly new and in which at least a new layout was produced for the chip contacts. This procedure involves a relatively large amount of development work and relatively high costs, which is of course disadvantageous and undesirable. By applying the measures according to the invention, the problem described above can be solved without the effort and cost of partly redeveloping the chip and hence in a considerably easier way, namely by providing the existing chip with additional bumps, elongated connecting bumps and—if they are not already present on the existing chip—bumps on the pads that are present, with the help of only a single bump mask, the locational conditions selected for the additional bumps being ones that are matched to the locational conditions of the package contacts in the new chip package, thus making it possible, in a very easy way, for electrically conductive connections to be made from the additional bumps to the package contacts. This is thus an easy way of ensuring that existing chips can easily be arranged for use in various different new chip packages, for which purpose only a single additional bumping process is necessary.

The measures according to the invention may also be employed with advantage for a further applicational purpose, namely when it is a question of using different chips, which may possibly be of different sizes, in the same chip package, because, with the help of the measures according to the invention, it is then easily possible, for each of the different chips, to use the bumps, elongated connecting bumps and additional bumps to move the locational positions of the chip-connecting contacts provided on the different chips to those positions in which easy and secure connection to the respective associated package contacts is possible and can be ensured.

What has been described above in connection with the invention is a chip card in which a chip package having a total of eight package contacts is provided. The chip card is thus a chip card with contacts. There also exist however many contactless chip cards that are commercially available and that likewise use chip packages, but the chip packages that are used in these contactless chip cards have only two or four or six package contacts that are intended for connection to contactless transmission means. The measures according to the invention may also be made with advantage in the case of such contactless chip cards. Somewhere else where the measures according to the invention may also be applied is to chip packages having a large number of package contacts.

The invention claimed is:

1. A chip comprising:
    a substrate,
    an integrated circuit provided on the substrate,
    a passivating layer that protects the integrated circuit and which is provided with through-holes,
    a plurality of chip contacts formed by pads, which chip contacts are accessible from outside the chip through said through-holes and connected to the integrated circuit, wherein at least some of the pads are connected to a corresponding bump of a particular material extending through the passivating layer and configured and arranged to provide an external contact via an upper surface of the corresponding bump when the chip is connected to an external package or chip,
    additional chip contacts formed by additional bumps of, or including, the particular material resulting from a bumping process used to apply the corresponding bumps, the corresponding bumps and the additional bumps being exposed and respectively configured and arranged to couple the chip contacts to an external circuit, and
    for each additional chip contact, connecting conductors formed by elongated connecting bumps of, or including, the particular material on the passivating layer and electrically connecting the additional chip contact to one of the corresponding bumps, and wherein the height of one of the corresponding bumps is greater than the height of one of the elongated connecting bumps and the height of one of the additional bumps to which the one of the corresponding bumps is respectively connected, wherein the heights are defined as a distance of the particular material above a plane in which an upper surface of the passivating layer lies,
    the particular material over the passivating layer consisting of a single material having a height defined by a thickness of the particular material extending uninterrupted between a lower surface of the particular material in direct contact with the passivating layer, and an upper surface of the particular material.

2. A chip as claimed in claim 1, wherein
    the chip contacts are arranged in a central region of the chip that is situated substantially in the center between two mutually opposing edges of the chip or of the passivating layer of the chip,
    the additional chip contacts are arranged adjacent at least one edge of the chip or of the passivating layer of the chip, and
    the chip is configured and arranged to couple a common signal to a flip-chip via the corresponding bumps and to a wire-bonded package via the additional bumps, and to pass signals between the flip-chip and the wire-bonded package via the corresponding bumps, elongated connecting bumps and a wire bond directly connected to the additional bumps, the corresponding bumps being higher than the additional bumps, relative to the passivating layer, the additional bumps being laterally between the corresponding bumps and said mutually opposing edges.

3. A chip as claimed in claim 2, wherein the chip contacts are arranged in a row and are substantially symmetrical about a plane of mirror symmetry of the chip or of the passivating layer of the chip, which plane of mirror symmetry extends parallel to the two mutually opposing edges of the chip or of the passivating layer of the chip and divides the chip or the passivating layer of the chip substantially with mirror symmetry.

4. A chip package having a chip as claimed in claim 1, wherein the chip is connected to the chip package via one of the additional bumps and the corresponding bumps.

5. A chip package as claimed in claim 4, wherein, in addition to said chip, the chip package contains a second chip having a number of chip contacts, wherein the chip contacts of the second chip and the chip contacts of said chip are arranged opposite one another, and wherein at least one chip contact of the second chip is electrically connected to one of the chip contacts.

6. A chip card comprising a chip package according to claim 4.

7. A chip according to claim 1, wherein the height of the one of the corresponding bumps is the same as the height of another one of the corresponding bumps.

8. A chip according to claim 1, wherein the additional chip contacts are located on the passivating layer in a predetermined pattern, the predetermined pattern being the same as a predetermined pattern of additional chip contacts on a second chip having a different internal circuit.

9. A chip according to claim 1, wherein the additional chip contacts are located on the passivating layer in a first predetermined pattern, and the plurality of chip contacts are located in a second predetermined pattern, the first predetermined pattern being the same as a predetermined pattern of additional chip contacts on a second chip.

10. A flip-chip apparatus including a chip according to claim 1, wherein
    the additional chip contacts are located on the passivating layer in a first predetermined pattern,
    the chip contacts are located in a second predetermined pattern, the second predetermined pattern of the chip contacts being the same as a predetermined pattern of chip contacts on a second chip,
    the additional chip contacts in the first predetermined pattern being a mirror of a predetermined pattern of additional chip contacts on the second chip, and the chip contacts are configured and arranged to contact the chip contacts in the second chip in a flip-chip arrangement.

11. A chip according to claim 1, wherein each additional bump is electrically connected to the integrated circuit solely via the connecting conductor and one of the chip contacts connected thereto.

12. A chip according to claim 1, wherein the passivating layer has a substantially planar upper surface, and wherein all of the particular material laterally immediately adjacent the additional bumps has an upper surface that is directly above the passivating layer.

13. A chip according to claim 1, wherein the particular material over the passivating layer is a single layer.

14. A chip according to claim 1, wherein the passivating layer is composed of silicon nitride.

15. A chip according to claim 1, wherein the particular material has an upper surface and a lower surface of the same material.

16. A chip according to claim 1, wherein the corresponding bumps are higher than the additional bumps, the additional bumps are configured and arranged to couple to an external circuit via wire bonding, and the corresponding bumps are configured and arranged to couple to an external circuit via flip-chip packaging, and the chip being configured and arranged to pass signals between external circuits respectively connected to the corresponding and additional bumps.

17. A chip according to claim 1, wherein both of the corresponding bumps and the additional bumps are coupled to an external circuit.

18. A chip comprising:
a substrate;
an integrated circuit provided on the substrate;
a passivating layer that protects the integrated circuit and which is provided with through-holes;
a plurality of chip contacts formed by pads, which chip contacts are accessible from outside the chip through said through-holes and connected to the integrated circuit, wherein at least some of the pads are connected to a corresponding bump of a particular material;
additional chip contacts formed by additional bumps of, or including, the particular material resulting from a bumping process used to apply the corresponding bumps, the corresponding bumps and the additional bumps being exposed and respectively configured and arranged to couple the chip contacts to an external circuit, the corresponding bumps being higher than the additional bumps and centrally located on the chip relative to the additional bumps; and
for each additional chip contact, connecting conductors formed by elongated connecting bumps of the particular material on the passivating layer and electrically connecting the additional chip contact to one of the corresponding bumps, all of the particular material in the chip that is in physical contact with the particular material of the additional bumps being over the passivating layer and consisting of a single material having a thickness extending uninterrupted from a lower surface in direct contact with the passivating layer to an upper surface,
wherein the height of one of the corresponding bumps is greater than the height of one of the elongated connecting bumps and the height of one of the additional bumps to which the one of the corresponding bumps is respectively connected, and wherein the heights are defined as a distance of the particular material above a plane in which an upper surface of the passivating layer lies.

19. A chip according to claim 18, wherein one of the corresponding bumps and the additional bumps is configured and arranged to couple to an external circuit via direct connection to a wire bond connected to an underlying package, and another one of the corresponding bumps and the additional bumps is configured and arranged to couple to an external circuit via flip-chip packaging.

20. A chip according to claim 18, wherein both of the corresponding bumps and the additional bumps are coupled to an external circuit.

* * * * *